United States Patent [19]

Tezuka et al.

[11] 4,287,436
[45] Sep. 1, 1981

[54] ELECTRICAL CIRCUIT FOR DRIVING AN INDUCTIVE LOAD

[75] Inventors: Hideharu Tezuka, Yokosuka; Yuuichiro Furukawa, Yokohama, both of Japan

[73] Assignee: Tokyo Shibaura Denki Kabushiki Kaisha, Kawasaki, Japan

[21] Appl. No.: 40,143

[22] Filed: May 18, 1979

[30] Foreign Application Priority Data

Jun. 7, 1978 [JP] Japan ................................ 53/68421

[51] Int. Cl.³ ...................... H03K 3/26; H01H 47/00
[52] U.S. Cl. .................................. 307/270; 307/255; 361/4; 361/159
[58] Field of Search ............... 307/270, 254, 255, 300, 307/200 A; 361/4, 88, 101, 159

[56] References Cited

U.S. PATENT DOCUMENTS

| | | | |
|---|---|---|---|
| 3,160,765 | 12/1964 | Krossa | 307/300 |
| 3,293,495 | 12/1966 | Smith | 307/254 |
| 3,436,563 | 4/1969 | Reaitz | 307/254 |
| 3,640,260 | 2/1972 | Mitlag et al. | 315/209 |
| 3,705,333 | 12/1972 | Galetto et al. | 361/159 |

Primary Examiner—Stanley D. Miller, Jr.
Assistant Examiner—B. P. Davis
Attorney, Agent, or Firm—Oblon, Fisher, Spivak, McClelland & Maier

[57] ABSTRACT

An electrical circuit for driving an inductive load includes an output transistor of one conductivity type and a detector transistor of the other conductivity type. The output transistor has an emitter connected to a power source, a base to which an input signal is supplied, and a collector connected to one end of an inductive load. The detector transistor has an emitter connected to the collector of the output transistor, a base connected to the other end of the inductive load, and a collector connected to the base of the output transistor. When the output transistor is rendered nonconductive, high counter electromotive force is induced between both ends of the inductive load. Thereby the detector transistor turns on and the output transistor is rendered conductive again.

15 Claims, 6 Drawing Figures

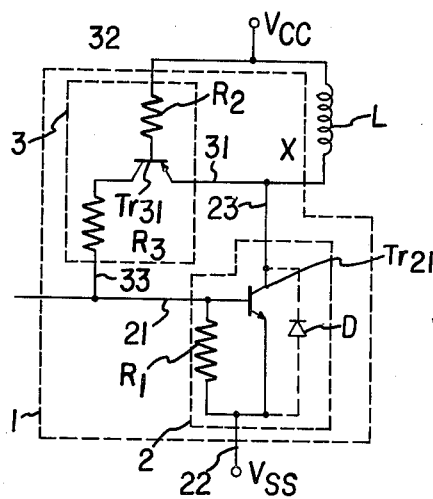
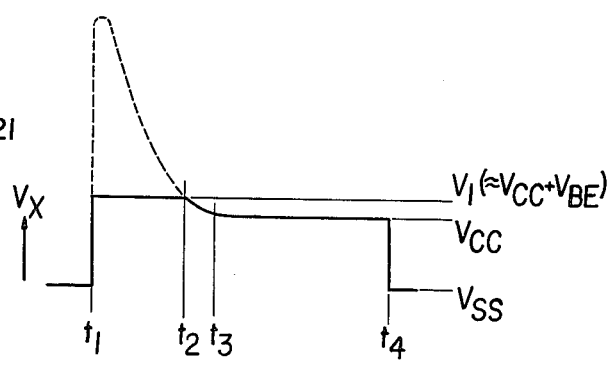
FIG. 1a    FIG. 1b
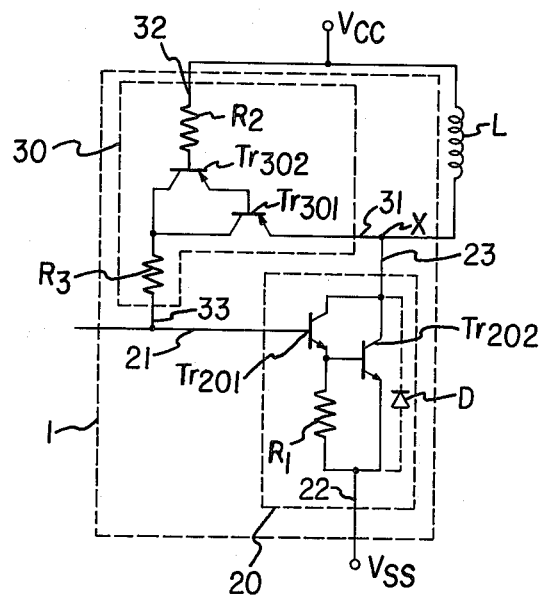
FIG. 2

ELECTRICAL CIRCUIT FOR DRIVING AN INDUCTIVE LOAD

BACKGROUND OF THE INVENTION

1. Field of the Invention

This invention relates to an electrical circuit for driving an inductive load, and more particularly to an improved electrical circuit for driving an inductive load which is protected against destruction from high counter electromotive force induced between both ends of an inductive load.

2. Description of the Prior Art

An inductive load is used, for example, as an ignition coil for an automotive car, a rotor of an alternator and so on.

Such an inductive load is generally driven by an output transistor connected to the inductive load, as shown in the U.S. Pat. No. 3,640,260. A current runs through the inductive load when the output transistor is conductive, and a current is cut off when the transistor is rendered nonconductive. When the output transistor is rendered nonconductive, counter electromotive force is induced between both ends of the inductive load. This counter electromotive force has been found to destroy the output transistor.

In a prior electrical circuit for driving an inductive load, a suppressor diode is connected between both ends of the inductive load in order to protect the output transistor against the destruction by the counter electromotive force.

The prior electrical circuit, however, exhibits some unfavorable characteristics, as nextly noted.

Firstly, more reverse current runs through the suppressor diode due to the counter electromotive force than the forward current which runs through a collector-emitter path of the output transistor when the output transistor is conductive; therefore the suppressor diode is undesirably too big. Accordingly it is difficult to form the suppressor diode in an integrated circuit device, and the overall cost of the electrical circuit for driving an inductive load becomes prohibitive.

Secondly, when the output transistor is formed in an integrated circuit device, a parasitic diode, which is forward connected to the suppressor diode, is usually formed between a collector of the output transistor and the substrate of the integrated circuit device. Therefore large current runs through a parasitic diode-suppressor diode path and destroys the integrated circuit device itself, when a reverse voltage due to, for example, a surge on an electric power line connected to the path or an erroneous connection of an electric power source is applied between both ends of the path.

SUMMARY OF THE INVENTION

Accordingly, one object of this invention is to provide an improved electrical circuit for driving an inductive load, which is protected against destruction by counter electromotive force induced between both ends of an inductive load.

Another object of this invention is to provide an electrical circuit for driving an inductive load which is adapted to be formed in an integrated circuit device.

A further object of this invention is to provide an electrical circuit for driving an inductive load which is protected against destruction by a surge or an erroneous connection of an electric power source.

Yet another object of this invention is to provide an electrical circuit for driving an inductive load, which is not only protected against destruction by the counter electromotive force of an inductive load, but also protected from destruction by a surge or an erroneous connection of an electric power source, and which is readily adaptable for fabrication in an integrated circuit device.

The foregoing and other objects of the invention are attained by providing an electrical circuit for driving an inductive load which comprises a switching circuit having a first terminal to which an input signal is supplied, a second terminal connected to a power source, and a third terminal connected to another power source through an inductive load. The third terminal is connected to the second terminal when the input signal has one potential and is disconnected from the second terminal when the input signal has another potential. The circuit of the invention further includes a detecting circuit having a first terminal connected to the third terminal of the switching circuit, and a second terminal connected to said another power source. The detecting circuit connects the second terminal of the switching circuit to the third terminal of the switching circuit in accordance with the counter electromotive force induced between both ends of the inductive load when the third terminal of the switching circuit is disconnected from the second terminal of the switching circuit.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1(a) is a circuit diagram of an electrical circuit for driving an inductive load according to a typical embodiment of this invention;

FIG. 1(b) is an illustration of a waveform denoting the operation of a point X in the electrical circuit of FIG. 1(a);

FIG. 2 is a circuit diagram of an electrical circuit for driving an inductive load according to another embodiment of the invention;

DESCRIPTION OF THE PREFERRED EMBODIMENTS

Figure 3:
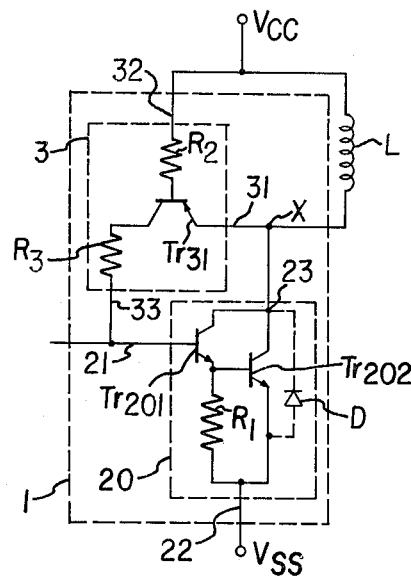
FIG. 3 is a circuit diagram of an electrical circuit for driving an inductive load according to yet another embodiment of the invention.

Referring now to the drawings, wherein like reference numerals designate identical or corresponding parts throughout the several views, and more particularly to FIG. 1(a) thereof, the electrical circuit for driving an inductive load is seen to include a switching circuit 2 which has a first terminal 21 as an input terminal to which an input signal is supplied, a second terminal 22 connected to a referential power source $V_{ss}$ (=ordinarily zero voltage) and a third terminal 23 as an output terminal connected to one end of the inductive load L such as a coil, and a detecting circuit 3 which has a first terminal 31 connected to the output terminal 23, a second terminal 32 connected to both another power source $V_{cc}$ (= positive voltage) and the other end of the inductive load L, and a third terminal 33 connected to the input terminal 21.

The switching circuit 2 is used to control a current which runs through the inductive load L in accordance with the input signal. This switching circuit 2 comprises an NPN type output transistor $Tr_{21}$ having a base connected to the input terminal 21, an emitter connected to the second terminal 22, and a collector connected to the output terminal 23.

As shown in FIG. 1(a), it is desirable to connect a resistor $R_1$ between the base and the emitter of the output transistor $Tr_{21}$ in order to prevent the transistor $Tr_{21}$ from erroneous triggering by noise.

When an input signal supplied to the input terminal 21 has a high potential, the collector-emitter path of the transistor $Tr_{21}$ is conductive and a current runs through the inductive load L. When the input signal has a low potential, the path is nonconductive and no current is conducted through the inductive load L.

The detecting circuit 3 is used to detect potential $V_x$ of the one end X of the inductive load L. This transistor detecting circuit 3 comprises a PNP type detector transistor $Tr_{31}$ having an emitter connected to the first terminal 31, a base connected to the power source $V_{cc}$ through a resistor $R_2$, and a collector connected to the third terminal 33 through a resistor $R_3$.

A diode D connected between the second terminal 22 and the output terminal 23 is shown in FIG. 1(a). This diode D is a parasitic diode which exists when the output transistor $Tr_{21}$ is formed in an integrated circuit device.

The resistor $R_2$ is used for protection of the integrated circuit device, wherein the output transistor $Tr_{21}$ is formed, against destruction by a current which runs through a parasitic diode D and an emitter-base path of the detector transistor $Tr_{31}$ when a negative surge occurs on a line connected to the power source $V_{cc}$ or a negative power source instead of the positive power source $V_{cc}$ is carelessly connected to the resistor $R_2$.

The resistor $R_3$ is used for protection of the output transistor $Tr_{21}$ from destruction by a current which runs through an emitter-collector path of the detector transistor $Tr_{31}$ when the detector transistor $Tr_{31}$ is conductive. This resistor $R_3$ may be connected between the emitter of the detector transistor $Tr_{31}$ and the first terminal 31 instead of between the collector of the detector transistor $Tr_{31}$ and the third terminal 33, however, it is desirable to connect the resistor $R_3$ as shown in FIG. 1(a) in order that the detecting transistor $Tr_{31}$ operates quickly.

There will now be described by reference to FIG. 1(a) and 1(b) operation of the electrical circuit for driving an inductive load 1.

Let it be assumed that the input terminal 21 is supplied with a high potential input signal.

(1) At time $t_1$: The potential of the input signal changes from high to low and the output transistor $Tr_{21}$ becomes nonconductive after being conductive.

Then counter electromotive force is induced between both ends of the inductive load L, and the potential $V_x$ of a junction point X common to the inductive load L and the output transistor $Tr_{21}$ would otherwise become high as shown with a broken line in FIG. 1(b). However, the potential $V_x$ is prevented from becoming higher than $V_1$ (where $V_1 \simeq V_{cc} + V_{BE}$, where $V_{BE}$ is a base-emitter voltage of the suppressor transistor $Tr_{31}$).

In other words, when the potential $V_x$ reaches $V_1$, the detector transistor $Tr_{31}$ becomes conductive and the output transistor $Tr_{21}$ also becomes conductive again, then electric energy (corresponding to the counter electromotive force) accumulated in the inductive load L disappears through the collector-emitter path of the output transistor $Tr_{21}$ and the potential $V_x$ does not increase above $V_1$. An emitter-base path of the detector transistor $Tr_{31}$ also, even though a little, contributes to the disappearance of the energy.

Therefore the output transistor $TR_{21}$ is not destroyed.

As apparent from the above description, the detector transistor $TR_{31}$ is used mainly to detect the potential $V_x$ and to inject a base current sufficient to make the output transistor $Tr_{21}$ conductive. Therefore the detector transistor $Tr_{31}$ is not required to be large, as compared with the suppressor diode used in the prior circuit, and the detector transistor $Tr_{31}$ is easily formed in an integrated circuit device.

Further, the resistor $R_2$ can be chosen large enough to suppress a current, which runs through the parasitic diode D and the emitter-base path of the detecting transistor $Tr_{31}$ when a negative surge occurs on the line connected to the power source $V_{cc}$ or a negative power source instead of the positive power source $V_{cc}$ is carelessly connected to the resistor $R_2$, in order that the integrated circuit device will not be destroyed even if the parasitic diode D with the output transistor $Tr_{21}$ is formed in the integrated circuit device; because a current, which runs through the resistor $R_2$ while the detector transistor $Tr_{31}$ is conductive, is very small.

(2) At time $t_2 \sim t_3$: The potential $V_x$ gradually decreases to $V_{cc}$. Both the detecting transistor $Tr_{31}$ and the output transistor $Tr_{21}$ become nonconductive gradually.

At time $t_3$: The potential $V_x$ is $V_{cc}$ and both the output transistor $Tr_{21}$ and the suppressing transistor $Tr_{31}$ are non-conductive.

(3) At time $t_4$: The potential of the input signal changes again from low to high, and the output transistor $Tr_{21}$ again becomes conductive after being nonconductive. Then the potential $V_x$ becomes $V_{ss}$ which maintains the detecting transistor $Tr_{31}$ in the nonconductive state.

As mentioned above, a typical embodiment of this invention provides an electrical circuit for driving an inductive load 1, in which the detecting transistor $Tr_{31}$ to detect the potential $V_x$ and to render the output transistor $Tr_{21}$ conductive when the counter electromotive force is induced is connected, thereby protecting the output transistor $Tr_{21}$ from being destroyed by the counter electromotive force and enabling the detecting transistor $Tr_{31}$ to be formed in an integrated circuit device.

Although, in the above embodiment, the collector of the detector transistor $Tr_{31}$ is connected to the base of the output transistor $Tr_{21}$ through the resistor $R_3$, the collector of the detector transistor $Tr_{31}$ may be directly connected to the reference power source $V_{ss}$ if the detector transistor $Tr_{31}$ is not required to be formed in an integrated circuit device. In this way the output transistor $TR_{21}$ is also protected from destruction by the counter electromotive force and the integrated circuit device in which the output transistor $TR_{21}$ with the parasitic diode D is formed, is protected from destruction by a surge or the like.

Further, though the switching circuit 2 has one output transistor $Tr_{21}$ in the above embodiment, a switching circuit including two output transistors interconnected in a Darlington configuration may be used instead of the circuit 2.

Still further, though the detecting circuit 3 has one detector transistor $Tr_{31}$ in the above embodiment, a transistor detecting circuit including two detector transistors interconnected in a Darlington configuration may be used instead of the circuit 3.

There will now be described by reference to FIG. 2 an electrical circuit for driving an inductive load 1 according to another embodiment of this invention as well as an inductive load L.

As apparent from FIG. 2, a difference between the preceding and succeeding embodiments is that the switching circuit 2 having one transistor $Tr_{21}$ and the detecting circuit 3 having one transistor $Tr_{31}$ are respectively replaced by a switching circuit 20 having two output transistors $Tr_{201}$, $Tr_{202}$ interconnected in a Darlington configuration, and a detecting circuit 30 having two detector transistors $Tr_{301}$, $Tr_{302}$ likewise interconnected.

The embodiment of FIG. 2 has substantially the same arrangement as the preceding one in other respects. The same parts of the embodiment of FIG. 2 as those of the preceding one are denoted by the same numerals.

The electrical circuit for driving an inductive load 1 comprises the switching circuit 20 which has a first terminal 21 as an input terminal to which an input signal is supplied, a second terminal 22 connected to a reference power source $V_{ss}$ (=ordinarily zero voltage) and a third terminal 23 as an output terminal connected to one end of the inductive load L such as a coil, and the detecting circuit 30 which has a first terminal 31 connected to the output terminal 23, a second terminal 32 connected to both another power source $V_{cc}$ (=positive voltage) and the other end of the inductive load L, and a third terminal 33 connected to the input terminal 21.

The switching circuit 20 comprises the first NPN type output transistor $Tr_{201}$ which has a base connected to the input terminal 21, an emitter, and a collector connected to the output terminal 23, and the second NPN type output transistor $Tr_{202}$ which has a base connected to the emitter of the first output transistor $Tr_{201}$, an emitter connected to the terminal 22, and a collector connected to the output terminal 23. A resistor $R_1$, as shown in FIG. 2 is preferentially connected between the base and the emitter of the second output transistor $Tr_{202}$ in order to prevent the transistor $Tr_{202}$ from erroneously being triggered by noise.

When an input signal supplied to the input terminal 21 has a high potential, each collector-emitter path of the transistors $Tr_{201}$, $Tr_{202}$ is conductive and a current flows through the inductive load L; and when the input signal has a low potential, each of the paths is nonconductive and current does not flow through the inductive load L.

The detecting circuit 30 comprises the first PNP type detecting transistor $Tr_{301}$ which has an emitter connected to the first terminal 31, a base, and a collector connected to the third terminal 33 through a resistor $R_3$, and the second PNP type detector transistor $Tr_{302}$ which has an emitter connected to the base of the first detector transistor $Tr_{301}$, a collector connected to the collector of the first detector transistor $Tr_{301}$, and a base connected to the second terminal 32 through a resistor $R_2$.

A diode D connected between the second terminal 22 and the output terminal 23 is shown in FIG. 2. This diode is a parasitic diode which exists in case the output transistors $Tr_{201}$, $Tr_{202}$ are formed in an integrated circuit device.

The resistor $R_2$ is used for protection of the integrated circuit device, in which the output transistor $Tr_{201}$, $Tr_{202}$ are formed, against destruction by a current which runs through the parasitic diode D, the emitter-base path of the transistor $Tr_{301}$, and the emitter-base path of the transistor $Tr_{302}$ when a negative surge occurs on a line connected to the power source $V_{cc}$ or a negative power source instead of the positive power source $V_{cc}$ is carelessly connected to the resistor $R_2$.

The resistor $R_3$ is used for protection of the first output transistor $Tr_{201}$ from destruction by a current which runs through the resistor $R_3$ when the detector transistors $Tr_{301}$, $Tr_{302}$ are conductive. This resistor $R_3$ may be connected between the emitter of the detector transistor $Tr_{301}$ and the first terminal 31 instead of between the collector of the detector transistor $Tr_{301}$ and the third terminal 33. However, it is desirable to connect the resistor $R_3$ as shown in FIG. 2 in order that the detector transistors $Tr_{301}$, $Tr_{302}$ operate quickly.

The operation of the electrical circuit for driving an inductive load 1 according to this embodiment arranged as mentioned above is almost the same as that of the preceding embodiment.

When the potential of an input signal supplied to the input terminal 21 changes from high to low, the output transistors $Tr_{201}$, $Tr_{202}$ become nonconductive and counter electromotive force is induced between both ends of the inductive load L.

The potential $V_x$ of a junction point X common to the inductive load L and the collectors of transistors $Tr_{201}$, $Tr_{202}$ becomes high. However, the potential $V_x$ is suppressed so as not to become higher than $V_2$ (where $V_2 \simeq V_{cc} + V_{BE301} + V_{BE302}$, and $V_{BE301}$ is the base-emitter voltage of the transistor $Tr_{301}$ and $V_{BE302}$ is the base-emitter voltage of the transistor $Tr_{302}$).

In other words, when the potential $V_x$ reaches $V_2$, the detector transistors $Tr_{301}$, $Tr_{302}$ become conductive and the output transistors $Tr_{201}$, $Tr_{202}$ also become conductive again, then electric energy (corresponding to the counter electromotive force) accumulated in the inductive load L disappears through the collector-emitter paths of the output transistors $Tr_{201}$, $Tr_{202}$ and potential $V_x$ does not increase more than $V_2$.

Therefore the output transistors $Tr_{201}$, $Tr_{202}$ are not destroyed.

As apparent from the above description, the detector transistors $Tr_{301}$, $Tr_{302}$ are used mainly to detect the potential $V_x$ and to inject a base current to the transistors $Tr_{201}$, $Tr_{202}$ sufficiently large to render the output transistors $Tr_{201}$, $Tr_{202}$ conductive. Therefore the detector transistors $Tr_{301}$, $Tr_{302}$ are not required to be so large, and can easily be formed in an integrated circuit device.

Further, the resistor $R_2$ is chosen with a high enough resistance to suppress the current which runs through the parasitic diode D, the emitter-base path of the transistor $Tr_{301}$, and the emitter-base path of the transistor $Tr_{302}$ when a negative surge occurs on the line connected to the power source $V_{cc}$ or a negative power source instead of the positive power source $V_{cc}$ is carelessly connected to the resistor $R_2$, in order that the integrated circuit device will not be destroyed even if the parasitic diode D associated with the output transistors $Tr_{201}$, $Tr_{202}$ are formed in the integrated circuit device; because a current, which runs through the resistor $R_2$ while the detector transistors $Tr_{301}$, $Tr_{302}$ are conductive, is so small.

Still further, a small current can be used as an input signal supplied to the input terminal 21 because the two output Darlington connected transistors $Tr_{201}$, $Tr_{202}$ have a current gain that is the product of their individual current gains.

Yet further, the resistor $R_2$ of this embodiment can have larger value than that of the preceding embodiment because the two suppressor Darlington connected transistors $Tr_{301}$, $Tr_{302}$ are used, such that the integrated circuit device wherein the parasitic diode D with the output transistors $Tr_{201}$, $Tr_{202}$ is formed can be protected from destruction by surges and the like more effectively.

There will now be described by reference to FIG. 3 an electrical circuit for driving an inductive load L according to still another embodiment of this invention.

As apparent from FIG. 3, a difference between the embodiment of FIG. 1(a) and the embodiment of FIG. 3 is that the switching circuit 2 comprising one transistor $Tr_{21}$ is replaced by a switching circuit 20 comprising two output Darlington connected transistors $Tr_{201}$, $Tr_{202}$.

The embodiment of FIG. 3 has substantially the same circuit arrangement as that of FIG. 1(a) in other respects. The switching circuit 20 is the same as the switching circuit 20 used in FIG. 2. The same parts of the embodiment of FIG. 3 as those of the embodiments of FIG. 1(a) or FIG. 2 are denoted by the same numerals, description thereof being omitted.

An operation of the electrical circuit for driving an inductive load 1 of this embodiment is almost the same as that of FIG. 1(a).

When the potential of an input signal changes from high to low, two output transistors $Tr_{201}$, $Tr_{202}$ become nonconductive and counter electromotive force is induced between both ends of the inductive load L.

A potential $V_x$ of a junction point X common to the inductive load L and the output transistors $Tr_{201}$, $Tr_{202}$ then becomes high. However, the potential $V_x$ is suppressed so as not to become higher than $V_1$ (where $V_1 \simeq V_{cc} + V_{BE}$, and $V_{BE}$ is the base-emitter voltage of a detector transistor $Tr_{31}$).

In other words, when the potential $V_x$ reaches $V_1$, the detector transistor $Tr_{31}$ becomes conductive and renders the output transistors $Tr_{201}$, $Tr_{202}$ conductive again, then electric energy (corresponding to the counter electromotive force) accumulated in the inductive load L disappears through a collector-emitter path of the output transistors $Tr_{201}$, $Tr_{202}$ and the potential $V_x$ does not increase more than $V_1$.

Therefore the output transistors $Tr_{201}$, $Tr_{202}$ are not destroyed.

Further the detector transistor $Tr_{31}$ is not required to be large and can easily be formed in an integrated circuit device, because the detector transistor $Tr_{31}$ is used mainly to detect the potential $V_x$ and to inject a base current large enough to render the output transistors $Tr_{201}$, $Tr_{202}$ conductive.

Still further, a resistor $R_2$ can be chosen large enough to suppress the current, which runs through the parasitic diode D, and the emitter-base path of the transistor $Tr_{31}$ when a negative surge occurs on a line connected to the power source $V_{cc}$ or the negative power source instead of the positive power source $V_{cc}$ is carelessly connected to the resistor $R_2$, in order that an integrated circuit device will not be destroyed even if a parasitic diode D with the output transistor $Tr_{201}$, $Tr_{202}$ are formed in the integrated circuit device, because the current, which runs through the resistor $R_2$ while the detector transistor $Tr_{31}$ is conductive, is very small.

Yet further, a small current can be used as an input signal supplied to the input terminal 21, because the Darlington connected transistors $Tr_{201}$, $Tr_{202}$ have a current gain that is the product of their individual current gains.

Further not only each size of the output transistors $Tr_{201}$, $Tr_{202}$ of this embodiment can be made smaller than that of FIG. 2 but also a detecting circuit 3 of this embodiment operates more quickly than the detecting circuit 30 of FIG. 2, because the potential $V_1$ is ordinarily lower than the potential $V_2$.

Figure 4:
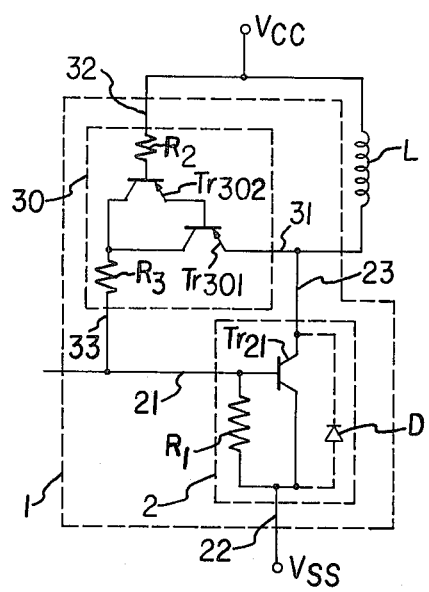
FIG. 4 is a circuit diagram of an electrical circuit for driving an inductive load according to still another embodiment of the invention.

FIG. 4 shows an electrical circuit for driving an inductive load 1, which comprises a switching circuit 2 as shown in FIG. 1(a) and a detecting circuit 30 as shown in FIG. 2, as well as an inductive load L.

This embodiment of FIG. 4 has substantially the same arrangement as that of FIG. 1(a) except for the detecting circuit 30. The same parts of the embodiment of FIG. 4 as those of the embodiment of FIG. 1(a) or FIG. 2 are denoted by the same numerals, description thereof being omitted.

The operation of the electrical circuit for driving an inductive load 1 of this embodiment is almost the same as that of FIG. 1(a).

When the potential of an input signal changes from high to low, the output transistor $Tr_{21}$ becomes nonconductive and counter electromotive force is induced between both ends of the inductive load L.

A potential $V_x$ at the junction point X common to the inductive load L and the collector of transistor $Tr_{21}$ otherwise would become high, however, the potential $V_x$ is suppressed so as not to become higher than $V_2$ (where $V_2 \simeq V_{cc} + V_{BE301} + V_{BE302}$, and $V_{BE301}$ is a base-emitter voltage of a detector transistor $Tr_{301}$ and $V_{BE302}$ is a base-emitter voltage of a detector transistor $Tr_{302}$), because the detector transistors $Tr_{301}$, $T_{302}$ become conductive and render the output transistor $Tr_{21}$ conductive again, when the potential $V_x$ reaches $V_2$.

Therefore the output transistor $Tr_{21}$ are not destroyed.

Further the detector transistors $Tr_{301}$, $Tr_{302}$ are not required to be large and can easily be formed in an integrated circuit device, because the detector transistors $Tr_{301}$, $Tr_{302}$ are used mainly to detect the potential $V_x$ and to inject a base current large enough to render the output transistor $Tr_{21}$ conductive.

Still further, a resistor $R_2$ can be chosen with a large enough resistance value to suppress the current, which flows through the parasitic diode D, the emitter-base path of the transistor $Tr_{301}$, and the emitter-base path of the transistor $Tr_{302}$ when a negative surge occurs on a line connected to a power source $V_{cc}$ or a negative power source instead of a positive power source $V_{cc}$ is carelessly connected to the resistor $R_2$, in order that an integrated circuit device will not be destroyed even if the parasitic diode D with the output transistor $Tr_{21}$ is formed in the integrated circuit device, because a current, which runs through the resistor $R_2$ while the detector transistors $Tr_{301}$, $Tr_{302}$ are conductive, is very small. Further, the resistance of resistor $R_2$ of this embodiment can have a larger value than that of the embodiment of FIG. 1(a) because two detector Darlington connected transistors $Tr_{301}$, $Tr_{302}$ are used, whereby the integrated circuit device having the parasitic diode D formed with the output transistor $Tr_{21}$ can be protected more effectively from destruction by surge voltages or the like.

Though an NPN type transistor in a switching circuit and a PNP type transistor in a detecting circuit are used in the above-mentioned embodiment, yet it is possible to use a PNP type transistor in a switching circuit and an NPN type transistor in a detecting circuit.

Figure 5:
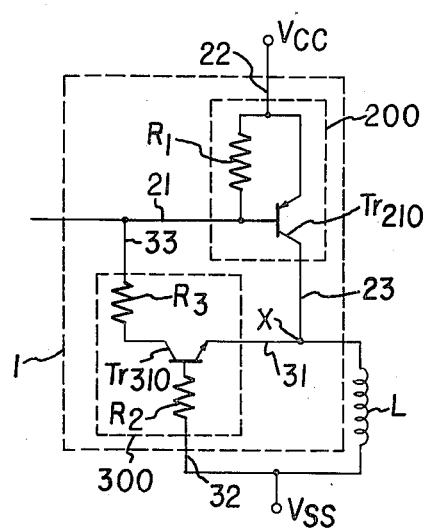
FIG. 5 is a circuit diagram of an electrical circuit for driving an inductive load using transistors opposite in conductivity type to those in FIG. 1(a).

FIG. 5 shows an electrical circuit for driving an inductive load 1, which comprises a switching circuit 200 having a PNP type output transistor $Tr_{210}$ opposite in conductivity type to the transistor $Tr_{21}$ in the electrical circuit in FIG. 1(a) and a detecting circuit 300 having an NPN type detector transistor $Tr_{310}$ opposite in conductivity type to the transistor $Tr_{31}$ in the electrical circuit in FIG. 1(a), as well as an inductive load L. A positive power source $V_{cc}$ is connected to a second terminal 22 of the switching circuit 200 and a referential power source $V_{ss}$ is connected to a second terminal 32 of the detecting circuit 300.

The embodiment of FIG. 5 has substantially the same arrangement as that of FIG. 1(a). The same parts of the embodiment of FIG. 5 as those of the embodiment of FIG. 1(a) are denoted by the same numerals.

The electrical circuit for driving an inductive load 1 performs substantially the same operation as that of the electrical circuit in FIG. 1(a) and the same effect as in the electrical circuit in FIG. 1(a) is obtained.

As mentioned above, this invention provides an improved electrical circuit for driving an inductive load which is protected against destruction by counter electromotive force induced between both ends of an inductive load.

Obviously, many modifications and variations of this invention are possible in the light of the above teachings. It is therefore to be understood that within the scope of the appended claims, this invention may be practiced otherwise than as specifically described.

What is claimed as new and desired to be secured by letters patent of the United States is:

1. An electrical circuit for driving an inductive load comprising:
   a switching circuit having a first terminal to which an input signal is supplied, a second terminal connected to a power source, and a third terminal connected to another power source through the inductive load;
   said third terminal connected to the second terminal when the input signal has one voltage potential and disconnected from the second terminal when the input signal has another voltage potential;
   a detecting circuit having a first terminal connected to the third terminal of the switching circuit, a second terminal connected to said another power source and a third terminal connected to the first terminal of the switching circuit; and
   said detecting circuit operable to switch said switching circuit to connect the second terminal of the switching circuit to the third terminal of the switching circuit in accordance with counter electromotive force induced between both ends of the inductive load when the third terminal of the switching circuit is disconnected from the second terminal of the switching circuit.

2. An electrical circuit for driving an inductive load comprising:
   an output transistor having a base, an emitter connected to a first power source, and a collector connected to a second power source through the inductive load; and
   a detector transistor formed of a conductivity type opposite that of said output transistor and having an emitter connected to the collector of the output transistor, a base connected to the second power source and a collector connected to the base of the output transistor.

3. An electrical circuit for driving an inductive load, comprising:
   an output transistor having a base, an emitter connected to a first power source, and a collector connected to a second power source through the inductive load; and
   a detector transistor formed of a conductivity type opposite that of said output transistor and having an emitter connected to the collector of the output transistor, and a base connected to the second power source through a first resistor, and a collector connected to the base of the collector of the output transistor through a second resistor.

4. An electrical circuit for driving an inductive load as set forth in claim 3, further comprising:
   the base of the output transistor connected to the first power source through a third resistor.

5. An electrical circuit for driving an inductive load, comprising:
   a first output transistor having a base, an emitter and a collector;
   a second output transistor formed of the same conductivity type as said first output transistor and having a base connected to the emitter of the first output transistor, an emitter connected to a first power source, and a collector connected to the collector of the first output transistor and to a second power source through the inductive load;
   a first detector transistor formed of a conductivity type opposite that of said first output transistor and having an emitter connected to the collector of the first output transistor, a base, and a collector connected to the base of the first output transistor; and
   a second detector transistor formed of a conductivity type opposite that of said first output transistor and having an emitter connected to the base of the first detector transistor, a base connected to the second power source, and a collector connected to the collector of the first detector transistor.

6. An electrical circuit for driving an inductive load, comprising:
   a first output transistor having a base, an emitter and a collector;
   a second output transistor having a base connected to the emitter of the first output transistor, an emitter connected to a first power source, and a collector connected to the collector of the first output transistor and to a second power source through the inductive load;
   a first detector transistor having an emitter connected to the collector of the first output transistor, a base, and a collector connected to the base of the first output transistor through a first resistor; and
   a second detector transistor having an emitter connected to the base of the first detector transistor, a base connected to the second power source through a second resistor, and a collector connected to the collector of the first detector transistor.

7. An electrical circuit for driving an inductive load according to claim 6, further comprising:
the first and second output transistors both being formed of one conductivity type and the first and second detector transistors being formed of the opposite conductivity type.

8. An electrical circuit for driving an inductive load as set forth in claim 6, further comprising:
the base of the second output transistor connected to the first power source through a third resistor.

9. An electrical circuit for driving an inductive load comprising:
a first output transistor having a base, an emitter and a collector;
a second output transistor formed of the same conductivity type as said first output transistor and having a base connected to the emitter of the first transistor, an emitter connected to a first power source, and a collector connected to the collector of the first output transistor and to a second power source through the inductive load; and
a detector transistor formed of a conductivity type opposite that of said first output transistor and having an emitter connected to the collector of the first output transistor, a base connected to the second power source through a first resistor, and a collector connected to the base of the first output transistor through a second resistor.

10. An electrical circuit for driving an inductive load according to claim 9, further comprising:
a third resistor connected between the emitter of the second output transistor and the first power supply.

11. An electrical circuit for driving an inductive load, comprising:
an output transistor having a base, an emitter connected to a first power source, and a collector connected to a second power source through the inductive load;
a first detector transistor formed of a conductivity type opposite that of said first output transistor and having an emitter connected to the collector of the output transistor, a base, and a collector connected to the base of the output transistor; and
a second detector transistor formed of a conductivity type opposite that of said first output transistor and having an emitter connected to the base of the first detector transistor, a base connected to the second power source, and a collector connected to the collector of the first detector transistor.

12. An electrical circuit for driving an inductive load, comprising:
an output transistor having a base, an emitter connected to a first power source, and a collector connected to a second power source through the inductive load;
a first detector transistor formed of a conductivity type opposite that of said first output transistor and having an emitter connected to the collector of the output transistor, a base, and a collector connected to the base of the output transistor through a first resistor; and
a second detector transistor formed of a conductivity type opposite that of said first output transistor and having an emitter connected to the base of the first detector transistor, a base connected to the second power source through a second resistor, and a collector connected to the collector of the first detector transistor.

13. An electrical circuit for driving an inductive load as set forth in claim 12, further comprising:
the base of the output transistor connected to the first power source through a third resistor.

14. An electrical circuit for driving an inductive load comprising:
a first output transistor having a base, an emitter and a collector;
a second output transistor formed of the same conductivity type as said first output transistor and having a base connected to the emitter of the first transistor, an emitter connected to a first power source, and a collector connected to the collector of the first output transistor and to a second power source through the inductive load; and
a detector transistor formed of a conductivity type opposite that of said first output transistor and having an emitter connected to the collector of the first output transistor, a base connected to the second power source, and a collector connected to the base of the first output transistor.

15. An electrical circuit for driving an inductive load comprising:
a switching circuit having a first terminal to which an input signal is supplied, a second terminal connected to a first power source, and a third terminal connected to a second power source through the inductive load;
said third terminal connected to the second terminal when the input signal has one voltage potential and disconnected from the second terminal when the input signal has another voltage potential;
a detecting circuit having a first terminal connected to the third terminal of the switching circuit, a second terminal connected to said second power source and a third terminal connected to the first power source; and
said detecting circuit operable to connect the second terminal of the switching circuit to the third terminal of the switching circuit in accordance with counter electromotive force induced between both ends of the inductive load when the third terminal of the switching circuit is disconnected from the second terminal of the switching circuit.

* * * * *